United States Patent
Kaelberer et al.

(10) Patent No.: US 7,919,346 B2
(45) Date of Patent: Apr. 5, 2011

(54) MICROMECHANICAL COMPONENT AND MANUFACTURING METHOD

(75) Inventors: Arnd Kaelberer, Schlierbach (DE); Jens Frey, Filderstadt (DE)

(73) Assignee: Robert Bosch GmbH, Stuttgart (DE)

( * ) Notice: Subject to any disclaimer, the term of this patent is extended or adjusted under 35 U.S.C. 154(b) by 237 days.

(21) Appl. No.: 12/090,566

(22) PCT Filed: Nov. 29, 2006

(86) PCT No.: PCT/EP2006/069044
§ 371 (c)(1),
(2), (4) Date: Jul. 2, 2008

(87) PCT Pub. No.: WO2007/068590
PCT Pub. Date: Jun. 21, 2007

(65) Prior Publication Data
US 2008/0315332 A1  Dec. 25, 2008

(30) Foreign Application Priority Data
Dec. 15, 2005 (DE) .......................... 10 2005 059 905

(51) Int. Cl.
*H01L 21/00* (2006.01)
(52) U.S. Cl. .............. 438/50; 438/48; 438/49; 257/414; 257/415; 257/416
(58) Field of Classification Search .................. 257/414, 257/415, 417; 438/48, 49, 50
See application file for complete search history.

(56) References Cited

U.S. PATENT DOCUMENTS

| | | | |
|---|---|---|---|
| 5,501,893 A | 3/1996 | Laermer et al. | |
| 5,679,436 A | 10/1997 | Zhao | |
| 5,756,901 A | 5/1998 | Kurle et al. | |
| 6,679,995 B1 | 1/2004 | Banjac et al. | |
| 6,876,048 B2 | 4/2005 | Fischer et al. | |
| 6,936,491 B2 * | 8/2005 | Partridge et al. | 438/48 |
| 2002/0127822 A1 | 9/2002 | Ueyanagi et al. | |
| 2004/0187592 A1 | 9/2004 | Sugiura | |
| 2007/0222006 A1 * | 9/2007 | Weber et al. | 257/414 |

FOREIGN PATENT DOCUMENTS

| | | |
|---|---|---|
| DE | 4241045 | 5/1994 |
| DE | 19537814 | 4/1997 |
| EP | 1228998 | 8/2002 |
| WO | WO 01/44822 | 6/2001 |

OTHER PUBLICATIONS

International Search Report, PCT International Patent Application No. PCT/EP2006/069044, dated Mar. 28, 2007.

* cited by examiner

*Primary Examiner* — Long K Tran
(74) *Attorney, Agent, or Firm* — Kenyon & Kenyon LLP

(57) ABSTRACT

A micromechanical component has a substrate, a first intermediate layer which is situated thereupon, and a first layer which is situated thereupon and is structured down to the first intermediate layer. A second intermediate layer is situated above the first layer. A second layer is situated on the former, at least one movable micromechanical structure being structured into the second layer. The second intermediate layer is removed in a sacrificial zone beneath the movable micromechanical structure and the first intermediate layer is partially removed in zones beneath the first layer. The movable micromechanical structure is provided with at least one stop surface on a bottom face, this stop surface being contactable with a zone of the first layer which is supported by the first intermediate layer by deflection of the movable micromechanical structure. A method for producing such a micromechanical component is also described.

6 Claims, 5 Drawing Sheets

MICROMECHANICAL COMPONENT AND MANUFACTURING METHOD

FIELD OF THE INVENTION

The present invention is directed to a micromechanical component and a method for manufacturing this component.

BACKGROUND INFORMATION

A manufacturing method and a micromechanical sensor manufactured in this way are described in German Patent Application No. DE 195 378 14 A1, which describes a surface micromechanical sensor having a first insulation layer, a conductive layer, a second insulation layer, and finally a micromechanical function layer over a substrate. The micromechanical function layer has movable micromechanical structures that are exposed by etching the insulation layers. In manufacturing the sensor, undercutting of the conductive layer may occur to some extent. When the movable micromechanical structures strike such undercut areas of the conductive layer, e.g., due to sharp impacts, breakage of the conductive layer may occur.

SUMMARY

An object of the present invention is to eliminate the risk of particle formation in the event of impacts against the movable mechanical structure on the undercut silicon printed conductors. This should increase the robustness of the sensor element with respect to high accelerations.

The present invention is directed to a micromechanical component having a substrate, a first intermediate layer situated thereon, and a first layer which is situated thereon and is structured down to the first intermediate layer. A second intermediate layer is situated above the first layer. A second layer is then situated above that, at least one movable micromechanical structure being structured into the second layer, the second intermediate layer being removed in a sacrificial zone beneath the movable micromechanical structure and the first intermediate layer being removed partially in some zones beneath the first layer.

According to an example embodiment of the present invention, the movable micromechanical structure has at least one stop surface on a bottom face; due to deflection of the movable micromechanical structure, the stop surface may be brought into contact with a zone of the first layer which is supported by the first intermediate layer.

According to an advantageous embodiment, the stop surface is formed by a stop. The stop surface may be clearly delimited in this way to advantage. The present invention described here also allows the production of stops on the bottom face of the movable micromechanical structure for delimiting deflection vertically to the direction of movement. These stops may act as an overload limitation or as spacers.

According to another advantageous embodiment, the first layer is a conductive layer, in particular silicon, preferably polycrystalline silicon. Damage to undercut silicon printed conductors when the movable micromechanical structure is struck is advantageously prevented. The robustness of micromechanical components with respect to high accelerations due to mechanical loads caused by impact or dropping of the component is thus increased.

The present invention is also directed to a method for manufacturing a micromechanical component having the following manufacturing steps:

Providing a substrate, applying a first intermediate layer, applying and structuring a first layer, applying a second intermediate layer, applying and structuring a second layer and exposing at least a portion of the second layer to form a movable structure by etching parts of the first intermediate layer and the second intermediate layer in a sacrificial zone.

According to an example method of the present invention, after applying the second intermediate layer and before applying the second layer in another step, a surface profile of the second intermediate layer is altered by applying a mask and then etching the second intermediate layer.

A surface profile may be created advantageously on the top surface of the second intermediate layer, and subsequently a complementary surface profile that is not determined by the surface profile of the structured first layer may be created on the bottom face of the second layer.

The process sequence according to the present invention may thus be used for acceleration sensors and rotational rate sensors as well as for any components having movable micromechanical structures in silicon surface micromechanics.

According to an advantageous embodiment of the method according to the present invention, the surface profile of the second intermediate layer is essentially planarized. A planar bottom face of the second layer is thus advantageously formed, which is produced subsequently and is particularly suitable as a stop surface in the vicinity of the movable structure to be later structured therefrom.

According to another advantageous embodiment, at least one negative shape for a stop in the second layer is structured into the surface profile of the second intermediate layer. The second layer produced subsequently advantageously forms a stop having a clearly delineated stop surface in the negative shape.

According to another advantageous embodiment, a first layer of the second intermediate layer is applied first, and then after the surface profile of the first layer has been altered, a second layer of the second intermediate layer is deposited thereon. The surface profile of a thin second intermediate layer, namely the first layer, may advantageously be modeled here first. To do so, for example, the first layer underneath may advantageously be used as an etch stop layer. A second layer of the second intermediate layer may then advantageously be deposited thereon essentially in a conformal manner to preserve the surface profile thereby created.

BRIEF DESCRIPTION OF THE DRAWINGS

Exemplary embodiments of the present invention are shown in the figures and explained in greater detail below.

DETAILED DESCRIPTION OF EXAMPLE EMBODIMENTS

The present invention will be explained in detail on the basis of the specific embodiments described below.

FIGS. 1 through 4 show a method for manufacturing surface micromechanical components according to the related art. The manufacturing method and a micromechanical sensor manufactured in this way are described in German Patent Application No. DE 195 378 14 A1. This document is herewith explicitly included in the present description as part of the disclosure.

Figure 1:
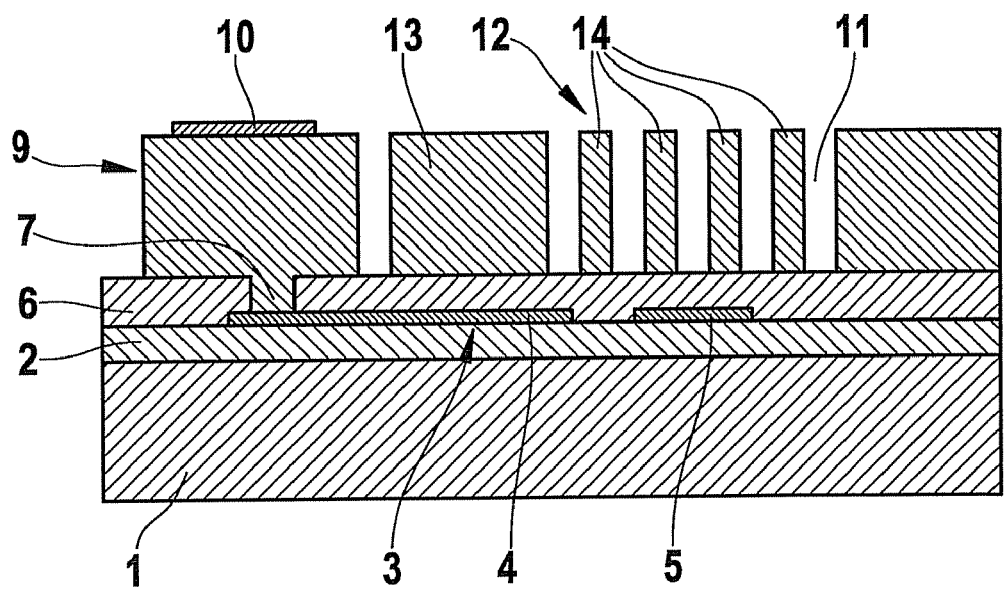
FIGS. 1 through 4 show a conventional method for manufacturing surface micromechanical components.

FIG. 1 shows the layer structure described below before removing a sacrificial layer. With this layer system, a first insulation layer 2 of an oxide is deposited first on a silicon substrate 1. A thin doped silicon layer 3 is then deposited on this first insulation layer 2 and forms a conductive layer. This layer is structured by a photolithographic process. Doped silicon layer 3 is subdivided into individual zones 4, 5 insulated from each other, which may function as printed conductors or as surface electrodes. A second insulation layer 6 of an oxide 6 is deposited over the layers applied previously. In a photolithographic process, the second insulation layer 6 is structured by introducing contact bushings 7, so-called contact vias, into the second insulation layer 6 through which underlying doped silicon layer 3 may be contacted. In addition, a thick silicon layer 9 is deposited, planarized, and doped. A structured metal layer 10 is next applied to this thick silicon layer 9. Thick silicon layer 9 is structured in another photolithographic process. To do so, a photomask is applied to the top side of thick silicon layer 9, also providing protection for structured metal layer 10 in the subsequent etching. Plasma etching of thick silicon layer 9 is next performed through openings in the photoresist mask, as described in German Patent No. DE 4241045 A1, introducing trenches 11 having a high aspect ratio. Trenches 11 extend from the top side of thick silicon layer 9 to second insulation layer 6. Silicon layer 9 is thus subdivided into individual zones 12, 13, which are insulated with respect to one another unless they are joined via the buried conductive layer formed by doped silicon layer 3.

Figure 2:
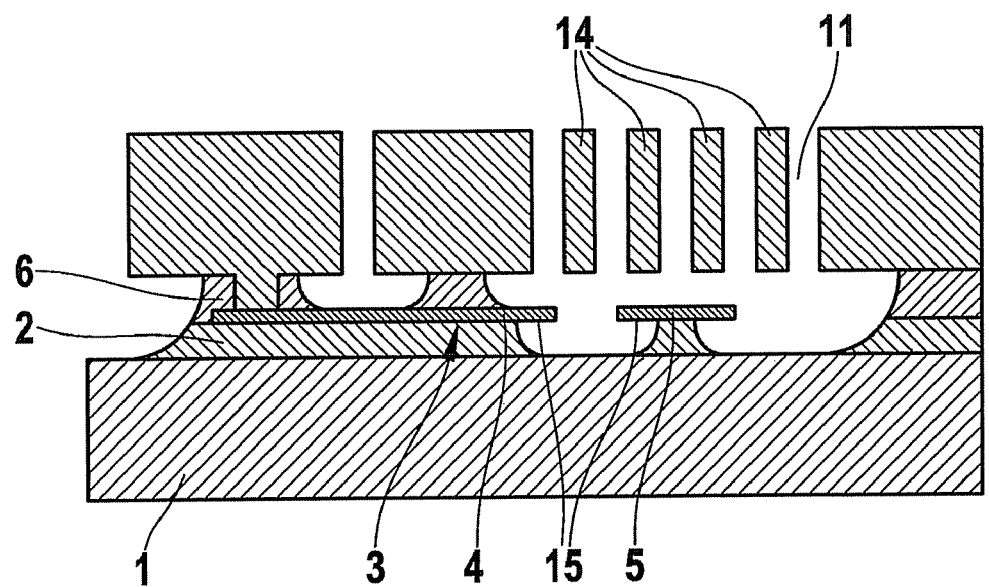

Two insulation layers 2 and 6 made of oxide are then removed through trenches 11 in the vicinity of movable structures 14, in particular freely movable structures, of the micromechanical component as shown in FIG. 2. By removing first insulation layer 2 during the etching of the sacrificial layer, structured printed conductors 4 and 5 are also partially undercut, thus resulting in undercut sections 15.

Figure 3:
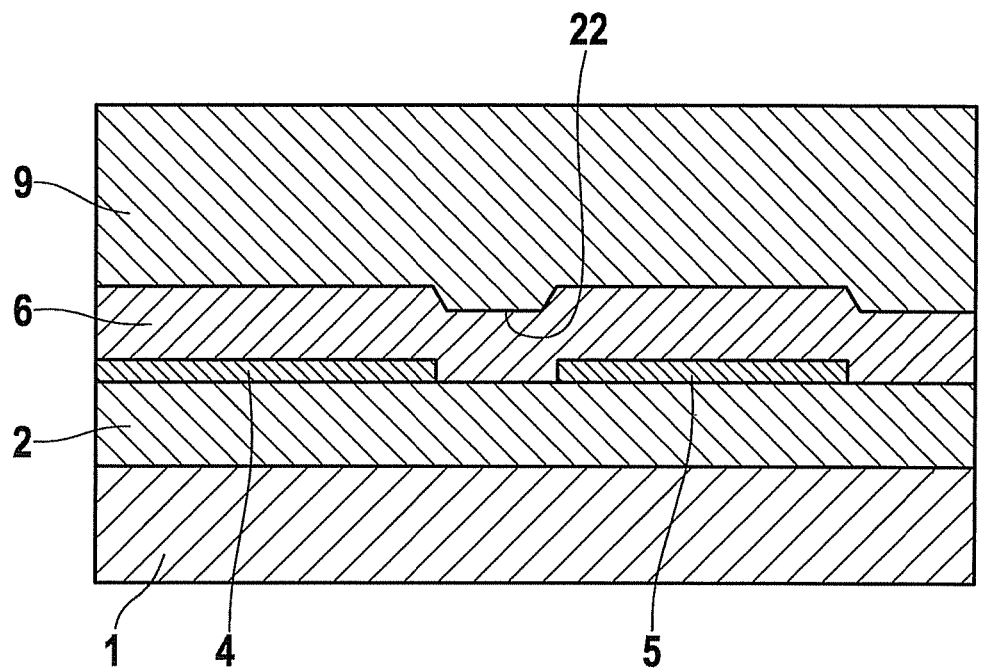

In a layered structure design, the surface profile of structured printed conductors 4 and 5 is reproduced conformally by second insulation layer 6 and silicon layer 9, as illustrated in FIG. 3. The shape of the surface profile of doped silicon layer 3 is therefore also transferred to bottom face 22 of silicon layer 9 together with structured zones 4 and 5. Bottom face 22 then subsequently has step-shaped structures.

In the method of the related art described here, under some circumstances, the problem may occur that undercut sections 15 of the printed conductors are broken off by mechanical contact of freely movable structures 14 with printed conductors 4 and 5, thus possibly forming electrically conductive silicon particles. Such phenomena occur during acceleration, e.g., due to dropping of the sensor element from a great height. The silicon particles may form an electrical shunt and thereby impair the electrical and mechanical functionality of the micromechanical component. In mechanical contacting of the freely movable structures 14, the steps on bottom phase 22 of silicon layer 9 have a reinforcing effect on the incidence of damage to printed conductors 4, 5. These steps concentrate the force, in the event of impact of movable structure 14, on a small area at the edge of undercut sections 15 which of course have only a low mechanical stability.

Figure 4:
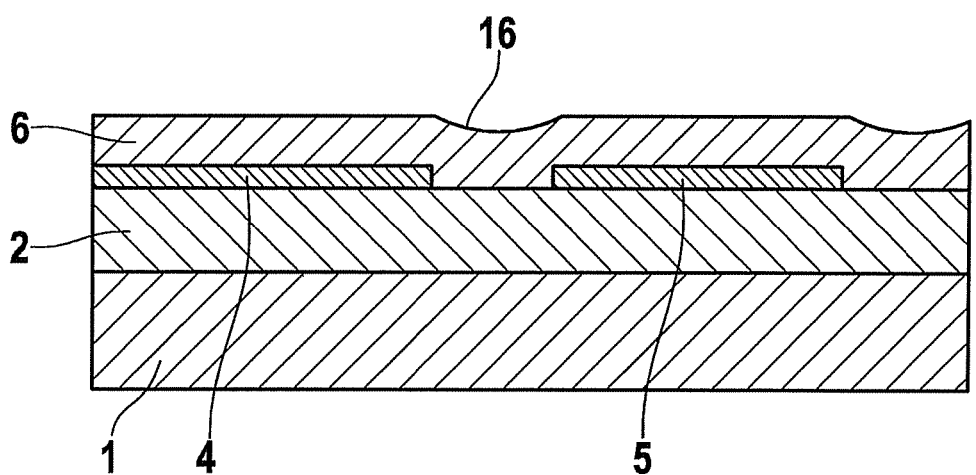

Under some circumstances it may not be sufficient to eliminate the steps on bottom face 22 of silicon layer 9 by chemical mechanical polishing (CMP) of second insulation layer 6 before applying silicon layer 9. The surface profile of structured printed conductors 4 and 5 reproduced in second insulation layer 6 The steps created by printed conductors 4 and 5 are not completely eliminated due to the elastic properties of the polishing cloth but instead are merely smoothed. The result is a surface profile having a reduced profile depth 16, as illustrated in FIG. 4.

Figure 5:
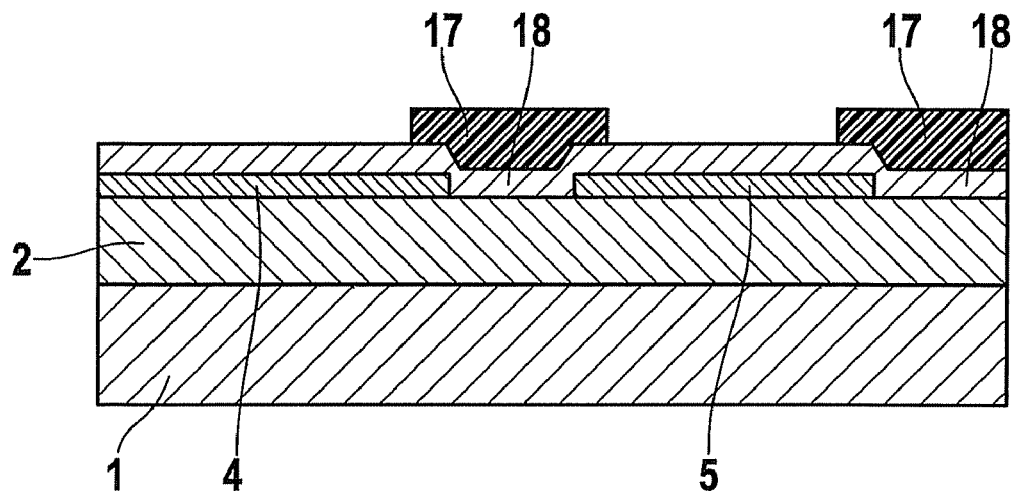
FIGS. 5 and 6 show a first exemplary embodiment of a component according to the present invention and its manufacture.
Figure 6:
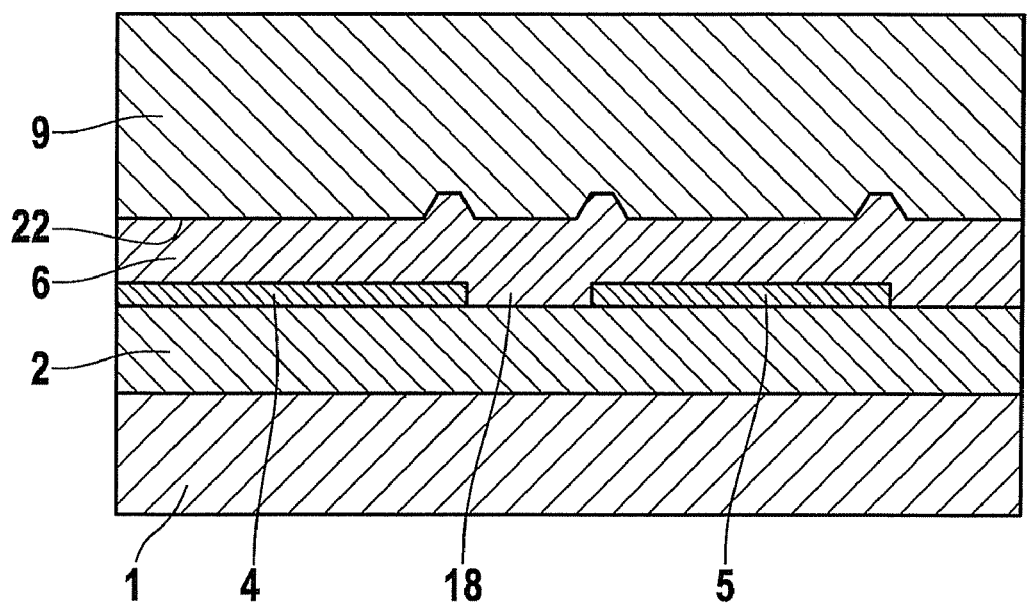

FIGS. 5 and 6 show a first exemplary embodiment of a component according to the present invention and its manufacture. After structuring silicon printed conductors 4 and 5, a thin oxide layer 18, in particular made of silicon oxide, is deposited. The thickness of this thin oxide layer 18 must be equal to or greater than the thickness of silicon printed conductors 4, 5.

According to FIG. 5, thin oxide layer 18 is structured by a photolithographic process using a mask 17 and a subsequent suitable etching method. In this process, the oxide above silicon printed conductor 4, 5 is removed. The oxide above silicon printed conductor 4, 5 is preferably removed completely except for a narrow edge. This edge is determined by the extent of mask 17 beyond edge areas of printed conductors 4, 5 and serves the purpose of reliably preventing undercutting of printed conductors 4, 5. The etching step for structuring thin oxide layer 18 may be performed as an isotropic or anisotropic etching process from the liquid or gas phase. Silicon printed conductors 4, 5 act as an etch stop in etching thin oxide layer 18, so that time-critical control of the etching process is not necessary. Second insulation layer 6 is then deposited above thin oxide layer 18 structured in this way and contact vias 7 are introduced. Thick silicon layer 9 is deposited in the remaining course of the process.

FIG. 6 shows the schematic layer structure after applying thick silicon layer 9. By using thin oxide layer 18 as an intermediate layer, the step in bottom face 22 of silicon layer 9 is prevented, in particular in the vicinity of movable structure 14. As a result, there are no longer any protruding elevations on bottom face 22 of silicon layer 9. The entire lower area of silicon layer 9 thus functions as a mechanically effective stop in the event of a possible impact of movable structures 14 due to acceleration perpendicular to the plane of the substrate, the areas of printed conductors 4 and 5 that are not undercut then acting as a second stable stop, namely as a counterpart to the first stop. The areas of printed conductors 4, 5 that are not undercut have a much greater mechanical stability than undercut sections 15 in the related art. Therefore, in the example embodiment of the micromechanical component according to the present invention, no parts of printed conductors 4, 5 are able to break off when movable structures 14 strike printed silicon conductors 4, 5.

Figure 7:
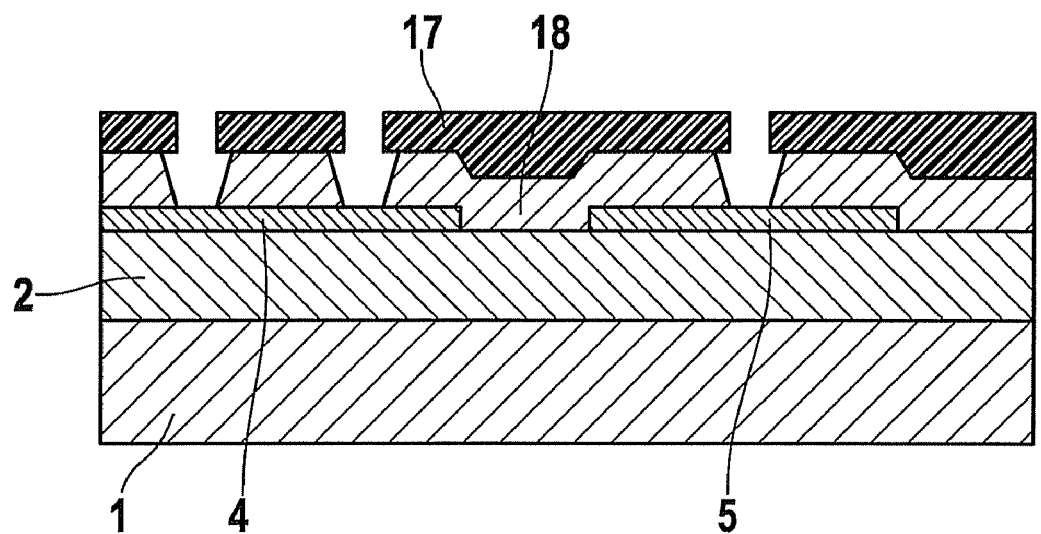
FIGS. 7 and 8 show a second exemplary embodiment of a component according to the present invention and its manufacture.
Figure 8:
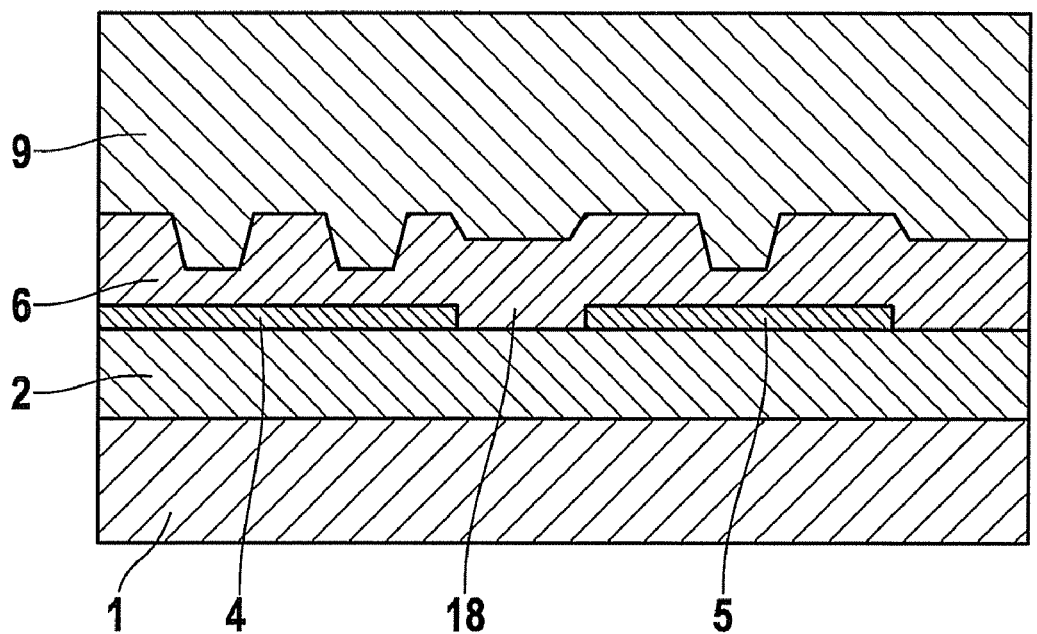

FIGS. 7 and 8 illustrate a second exemplary embodiment of the micromechanical component according to the present invention and its manufacture.

In a second variant of the embodiment, as in the first example method according to the present invention described above, a thin oxide layer 18 is deposited on silicon printed conductors 4 and 5 that are already structured and the oxide layer is deposited and structured via a photolithographic process using a mask 17. This is illustrated in FIG. 7. The layer thickness of thin oxide layer 18 is greater, however, preferably at least twice as great as the thickness of silicon layer 3. Thin oxide layer 18 is opened here only locally above printed conductors 4, 5. This is accomplished by a conventional etching process. Second insulation layer 6 is deposited subsequently and contact vias 7 are structured. In the remaining course of the process, thick silicon layer 9 is deposited.

FIG. 8 shows a schematic diagram of the layer structure after application of silicon layer 9, in particular by growing it there. The advantage of this method is that nubby stops are producible on the bottom face of the thick silicon layer. These stops may be used for limiting overload in a direction perpendicular to the substrate surface, i.e., the z direction, or as a spacer to, for example, prevent movable structures 14 from sticking due to capillary forces in wet chemical etching of the sacrificial layers, namely insulation layers 6 and 2.

In general, the present invention may be used for a surface mechanical component having at least one movable structure 14 which is manufactured by sacrificial layer etching, among other methods, if this component has a substrate 1, a first intermediate layer 2 above that, a first layer 3 above that, this first layer being structured, a second intermediate layer 6 above that and a second layer 9 above that, movable structure 14 being structured out of the second layer. According to the present invention, the component has a movable micromechanical structure 14 having at least one stop surface on a bottom face. By deflection of movable micromechanical structure 14, the stop surface may be brought into contact with an area of first layer 3, which is supported by first intermediate layer 2. The reference numerals are transferred from the exemplary embodiments described previously to this generalized exemplary embodiment.

Figure 9:
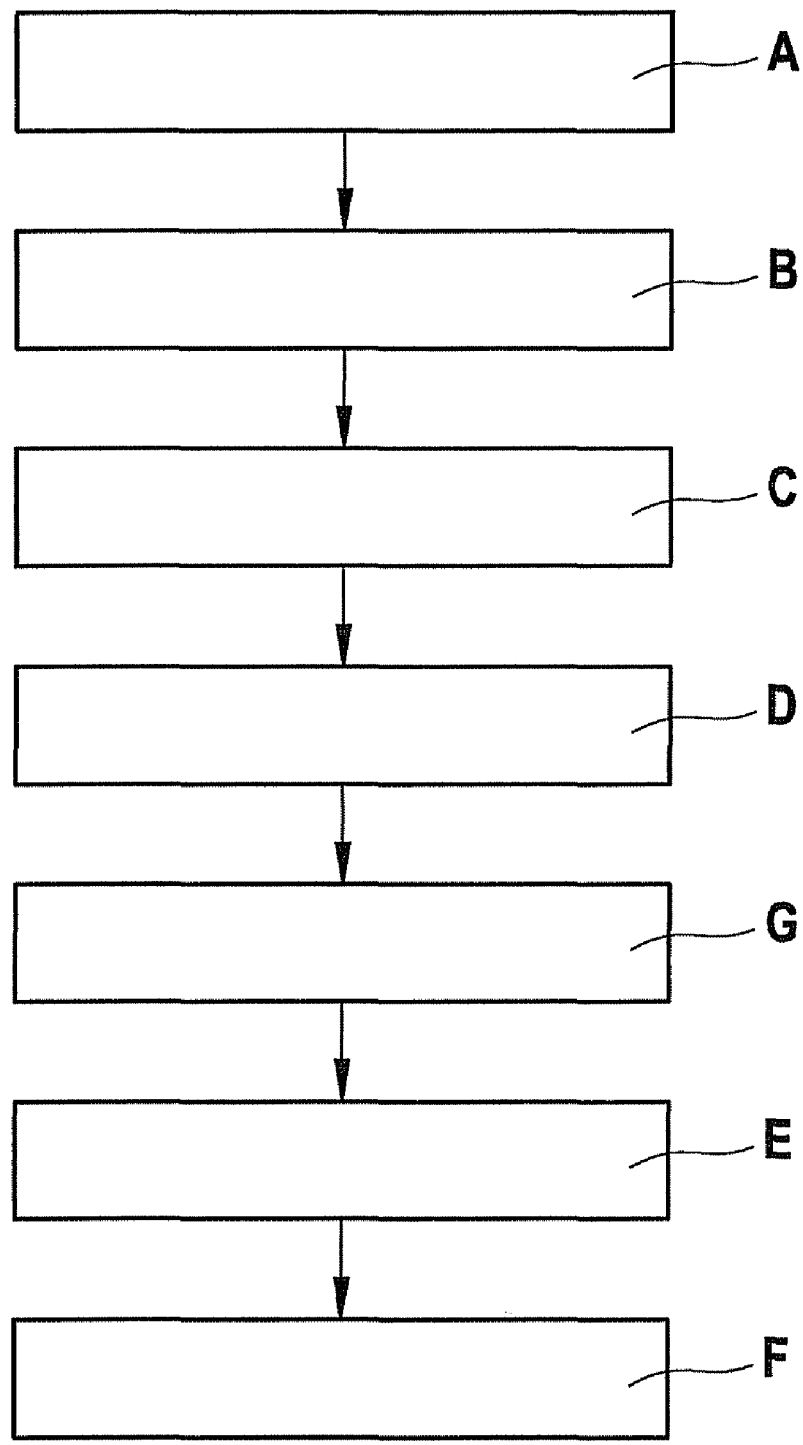
FIG. 9 shows a schematic diagram of an example manufacturing method according to the present invention.

FIG. 9 shows a schematic diagram of the example manufacturing method according to the present invention. It shows an example method for manufacturing a micromechanical component having the manufacturing steps:

(A) Providing a substrate 1,
(B) Applying a first intermediate layer 2,
(C) Applying and structuring a first layer 3,
(D) Applying a second intermediate layer 18, 6,
(E) Applying and structuring a second layer 9,
(F) Exposing at least a portion of second layer 9 to form a movable structure 14 by etching parts of first intermediate layer 2 and second intermediate layer 18, 6 in a sacrificial zone, a surface profile of second intermediate layer 18, 6 being altered in a step (G) after step (D) but before step (E) by applying a mask and then etching second intermediate layer 6.

In a first example embodiment, the surface profile of second intermediate layer 6 is generally planarized.

In a second example embodiment, at least one negative shape for a stop is structured into second layer 9 into the surface profile of second intermediate layer 6.

In a further example embodiment, in step (D) first a first layer of second intermediate layer 18 is applied and in step (G) a second layer of first intermediate layer 6 is deposited after altering the surface profile of the first layer of second intermediate layer 18.

What is claimed is:

1. A method for manufacturing a micromechanical component comprising:
   (A) providing a substrate;
   (B) applying a first intermediate layer to the substrate;
   (C) applying to the first intermediate layer, and structuring, a first layer;
   (D) applying a first layer of a second intermediate layer to the first layer;
   (E) modifying a surface profile of the applied first layer of the second intermediate layer by applying a mask and then etching the first layer;
   (F) depositing on the modified first layer of the second intermediate layer a second layer of the second intermediate layer;
   (G) applying to the second intermediate layer, and structuring, a second layer; and
   (H) exposing at least a portion of the second layer to form a movable structure by etching out parts of the first intermediate layer and the second intermediate layer in a sacrificial zone.

2. The method for manufacturing a micromechanical component as recited in claim 1, wherein the surface profile of the second intermediate layer is planarized.

3. The method for manufacturing a micromechanical component as recited in claim 1, wherein at least one negative shape for a stop in the second layer is structured into the surface profile of the second intermediate layer.

4. The method for manufacturing a micromechanical component as recited in claim 1, wherein the first layer is a conductive layer.

5. The method for manufacturing a micromechanical component as recited in claim 4, wherein the conductive layer is made of silicon.

6. The method for manufacturing a micromechanical component as recited in claim 5, wherein the silicon is polycrystalline silicon.

* * * * *